(12) United States Patent
Jin

(10) Patent No.: US 6,300,801 B1
(45) Date of Patent: Oct. 9, 2001

(54) OR GATE CIRCUIT AND STATE MACHINE USING THE SAME

(75) Inventor: Kyoung Chun Jin, Seoul (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 0 days.

(21) Appl. No.: 09/404,142

(22) Filed: Sep. 27, 1999

(30) Foreign Application Priority Data

Sep. 28, 1998 (KR) .................................................. 98-40399

(51) Int. Cl.⁷ ................................................ H03K 19/096
(52) U.S. Cl. .............................. 326/121; 326/95; 326/98; 365/203
(58) Field of Search .................................. 326/93, 95, 98, 326/112, 121, 40, 44; 365/203

(56) References Cited

U.S. PATENT DOCUMENTS

| 4,841,174 | * | 6/1989 | Chung et al. | 326/45 |
| 4,959,646 | * | 9/1990 | Podkowa et al. | 340/825.83 |
| 5,258,666 | * | 11/1993 | Furuki | 307/449 |
| 5,287,018 | * | 2/1994 | Williams et al. | 326/44 |
| 5,453,708 | * | 9/1995 | Gupta et al. | 326/98 |
| 5,525,916 | * | 6/1996 | Gu et al. | 326/98 |
| 5,892,727 | * | 4/1999 | Nakagawa | 365/230.06 |
| 5,936,449 | * | 8/1999 | Huang | 327/211 |
| 5,953,737 | | 9/1999 | Estakhri et al. | |
| 5,973,514 | * | 10/1999 | Kuo et al. | 326/98 |
| 6,040,716 | * | 3/2000 | Bosshart | 326/98 |
| 6,075,386 | * | 6/2000 | Naffziger | 326/98 |

FOREIGN PATENT DOCUMENTS

60233932-A * 11/1985 (JP) .

* cited by examiner

Primary Examiner—Michael Tokar
Assistant Examiner—Daniel D. Chang
(74) Attorney, Agent, or Firm—Pennie & Edmonds LLP

(57) ABSTRACT

The OR gate circuit according to the present invention comprises a PMOS transistor for supplying a supply power depending on the clock signal, a plurality of PMOS transistors for outputting the supply power supplied from the PMOS transistor depending on inverted input signals, and a NMOS transistor for controlling the output depending on the clock signal.

14 Claims, 5 Drawing Sheets

OR GATE CIRCUIT AND STATE MACHINE USING THE SAME

BACKGROUND OF THE INVENTION

1. Field of the Invention

The invention relates generally to an OR gate circuit, and more particularly to, a gate circuit, which can control the supply power by means of clocks, thus reducing the number of transistors and the layout area.

2. Description of the Prior Art

FIG. 1 shows a general OR gate circuit, the structure of which will be explained below.

First to third PMOS transistors P1 to P3 are connected between the supply terminal from which the supply power VCC is provided, and a node K1, to each gate thereof is inputted the input signals A, B and C. First to third NMOS transistors N1 through N3 are connected between the node K1 and the ground terminal VSS, wherein each of the gates thereof is connected to the first through third PMOS transistors P1 to P3. An inverter I is connected between the node K1 and the output terminal OUT and inverts the potential of the node K1. The number of PMOS transistors P1 through P3 and the NMOS transistors N1 through N3 may be varied depending on the number of the input signals.

The operation of the OR gate circuit having the above-mentioned construction will be explained below.

If the input signals A, B and C are a low level, the PMOS transistors P1 to P3 are turned on and the NMOS transistors N1 through N3 are turned off. Thus, the potential of the node K1 is maintained at a high level by the supply power VCC via the PMOS transistors P1 through P3. At this time, the potential of the node K1, which is maintained at a high level, is inverted into a low level via the inverter I, so that the inverted potential can be outputted to the output terminal OUT.

If any one of the input signals A, B and C is a low level, for example the input signal B applied to the second PMOS transistor P2 is a low level, the second PMOS transistor P2 is turned on and the second NMOS transistor N2 is turned off. However, as the input signals A and C applied to the gates of the first and third PMOS transistors P1 and P3 are maintained at a high level, the first and third PMOS transistors P1 and P3 is turned off, while the first and third NMOS transistors N1 and N3 is turned on. Therefore, the potential of the node K1 becomes a low level. The potential of the node K1, which is maintained at a low level, is inverted into a high level via the inverter I, so that the inverted potential can be outputted to the output terminal OUT.

If all of the input signals A, B and C are HIGH, the first through third PMOS transistors P1 through P3 are turned off and the first through third NMOS transistors N1 through N3 are turned on. Therefore, the potential of the node K1 becomes a LOW state. The potential of the node K1, which is maintained at LOW state, is inverted into HIGH state via the inverter I, so that the inverted potential can be outputted to the output terminal OUT.

As described above, since the conventional OR gate circuit is made of the pairs of the PMOS transistors and NMOS transistors, the number of the transistors becomes greater and thus increases the layout.

SUMMARY OF THE INVENTION

It is therefore an object of the present invention to provide a OR gate circuit which can reduce the number of the transistors, thus reducing the layout area.

In order to accomplish the above object, the OR gate circuit according to the present invention is characterized in that it comprises a first switching means for supplying a supply power according to clock signals; a plurality of switching elements for outputting the supply power received via said first switching means to output means, respectively, in response to each of inverted input signals; and a second switching means for controlling said output terminals in response to said clock signals.

The state machine according to a first embodiment of the present invention is characterized in that it comprises a first delay means for delaying clock signals for a first set time; a second delay means for delaying output signals from said first delay means for a second set time; a circuit for logically combining said clock signals and said output signal from said second delay means; a first switching means for switching the supply of a supply power in response to the output from said circuit; a plurality of switching means each connected in parallel between said first switching means and an output terminal, said switching means being controlled depending on the input signals, respectively; a second switching means connected between said output terminal and a ground, said switching means being controlled depending on the output signals from the first delay means; and a latch means for latching the potential of said output terminal.

The state machine according to a second embodiment of the present invention is characterized in that it comprises a first delay means for delaying clock signals for a first set time; a second delay means for delaying output signals from said first delay means for a second set time; a circuit for logically combining said clock signals and said output signal from said second delay means; a first switching means for switching the supply of a supply power in response to the output from said circuit; a plurality of switching means each connected in parallel between said first switching means and a plurality of output terminals, said switching means being controlled depending on the input signals, respectively; a second switching means connected between said plurality of output terminal and a ground, said switching means being controlled depending on the output signals from the first delay means; a plurality of latch means each for latching each of the potentials of said plurality of output terminal depending on said clock clocks; and decoders for decoding the outputs from said plurality of latch means.

The state machine according to a third embodiment of the present invention includes a plurality of switching means connected between a supply power and an output terminal, said switching means being controlled input signals, respectively; transistors connected between said output terminal and a ground, the gate of which being connected to a supply power; and a latch circuit for latching the potential of said output terminal.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
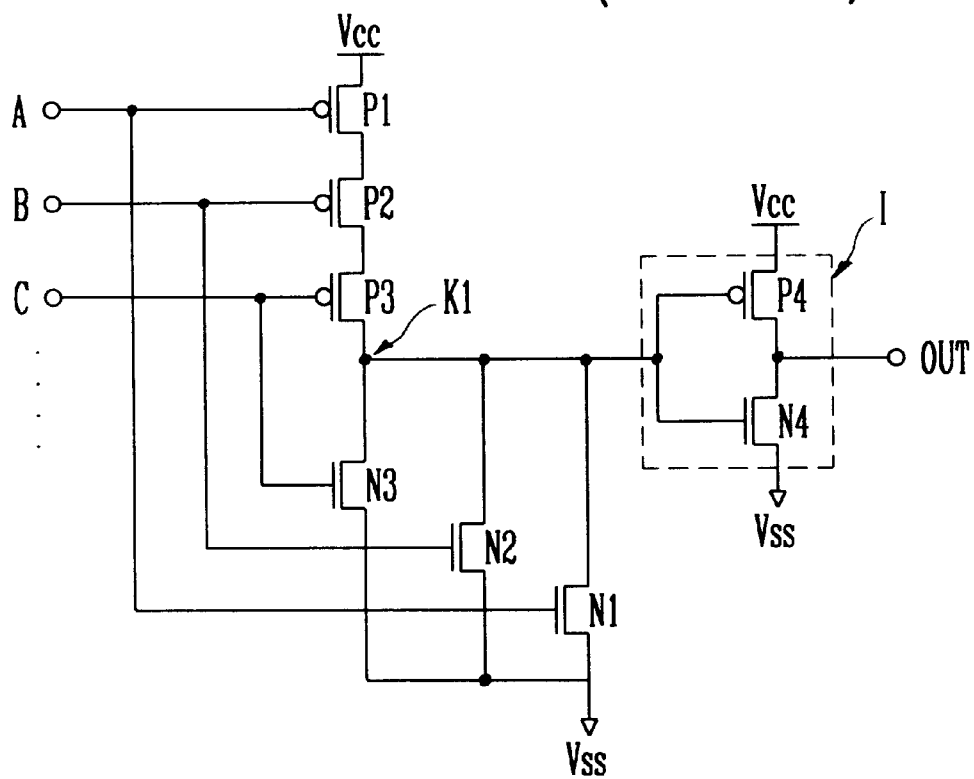
FIG. 1 is a general OR gate circuit.

The present invention will be described in detail by way of a preferred embodiment with reference to accompanying drawings, in which like reference numerals are used to identify the same or similar parts.

Figure 2:
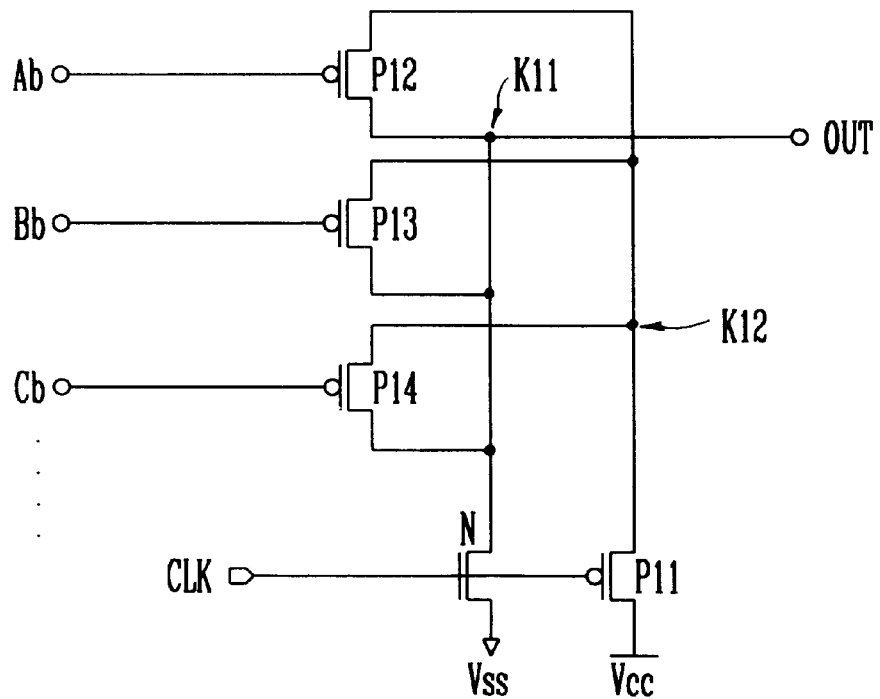
FIG. 2 is a OR gate circuit which can be controlled by means of clocks according to the present invention.

FIG. 2 is a OR gate circuit according to the present invention, which is controlled by means of clocks CLK.

The first PMOS transistor P11, which is turned on depending on the clock CLK, is connected between the supply terminal and the node K12. The PMOS transistors P12, P13 and P14 is in parallel connected between the node K11 and the node K12, to each of the gate terminals of which is inputted the input signals Ab, Bb and Cb, respectively. The NMOS transistor N11, which is controlled depending on the clock CLK, is connected between the node K11 and the ground terminal, and the node K11 is connected to the output terminal OUT.

The operation of the OR gate circuit according to the present invention, having the above-mentioned construction, will be explained below.

First, the operation when the clock is LOW will be explained. The NMOS transistor N11 connected to the ground terminal VSS by means of the clock being at LOW state is turned off, while the PMOS transistor P11 is turned on, so that the supply power VCC can be supplied into the PMOS transistor P12. At this state, if all of the input signals Ab, Bb and Cb are LOW, they are inverted into a HIGH state by means of an inverting means (not shown). Then, if the inverted signals are applied to the second through the fourth PMOS transistors P12 through P14, the second through fourth PMOS transistors P12 through P14 are all turned off, so that the potential of the node K11 becomes a LOW state. The potential of the node K11, which is maintained at LOW, becomes the potential of the output terminal OUT. If any one of the input signals is applied at HIGH, for example, if the signal applied to the gate of the second PMOS transistor P12 is applied at HIGH state, the signal is inverted into a LOW state via the inverting means. Thus, the second PMOS transistor P12 is turned on and the remaining third and fourth PMOS transistors P13 and P14 are turned off. Accordingly, the potential of the node K11 becomes a HIGH state, and this potential becomes the potential of the output terminal OUT.

The operation of the circuit when the clock is applied at HIGH will be explained. The NMOS transistor N11 connected to the ground terminal VSS is turned on by means of the clock applied at HIGH, while the first PMOS transistors P11 providing the supply power VCC is turned off, so that it does not provide the power. Therefore, as the potential of the node K11 is maintained at LOW regardless of the input signals, the potential of the output terminal OUT is maintained at LOW state.

Figure 3:
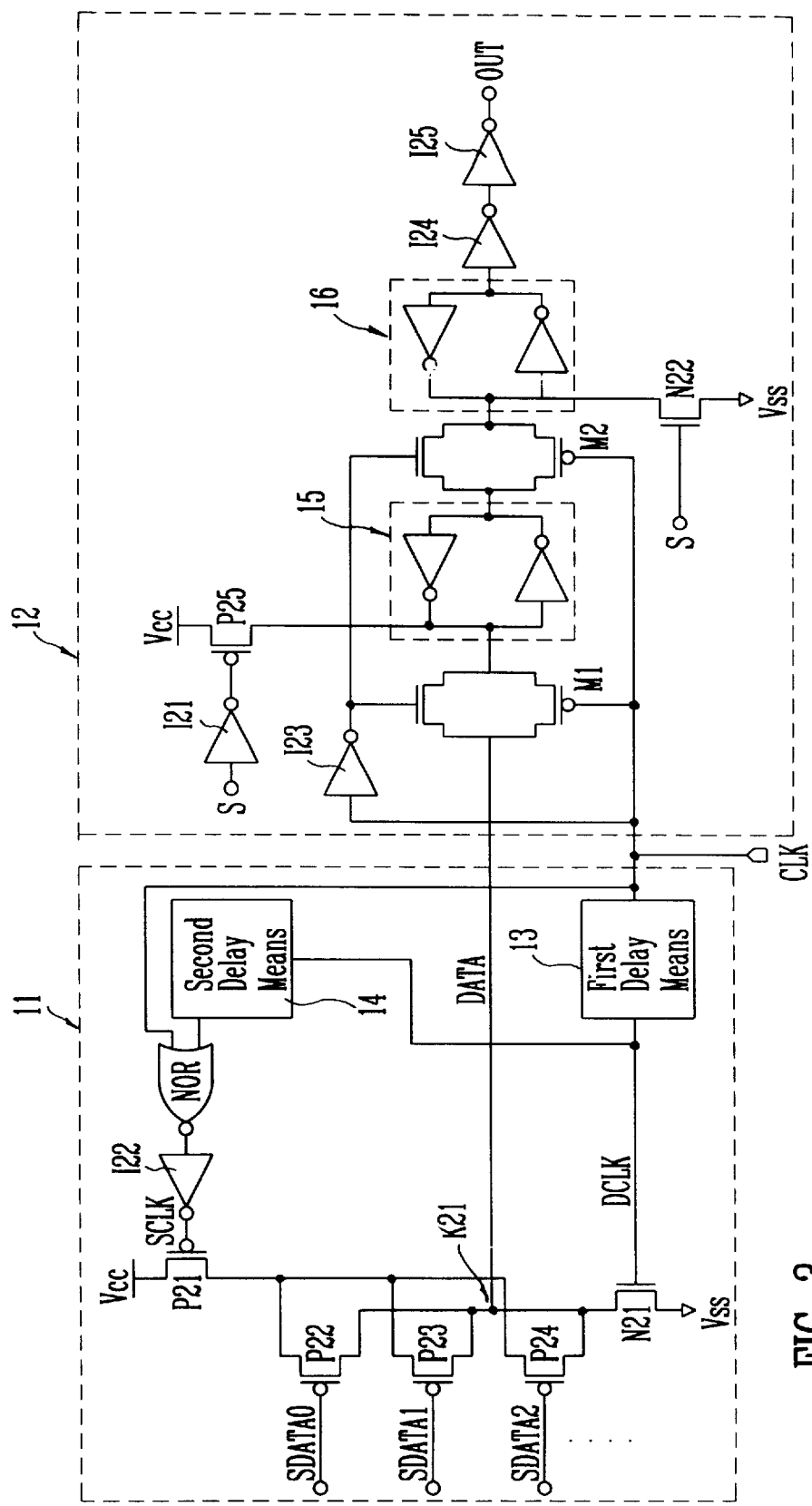
FIG. 3 shows a circuit diagram for illustrating a first embodiment in which the OR gate circuit according to the present invention is applied to the latch block of the state machine.
Figure 4:
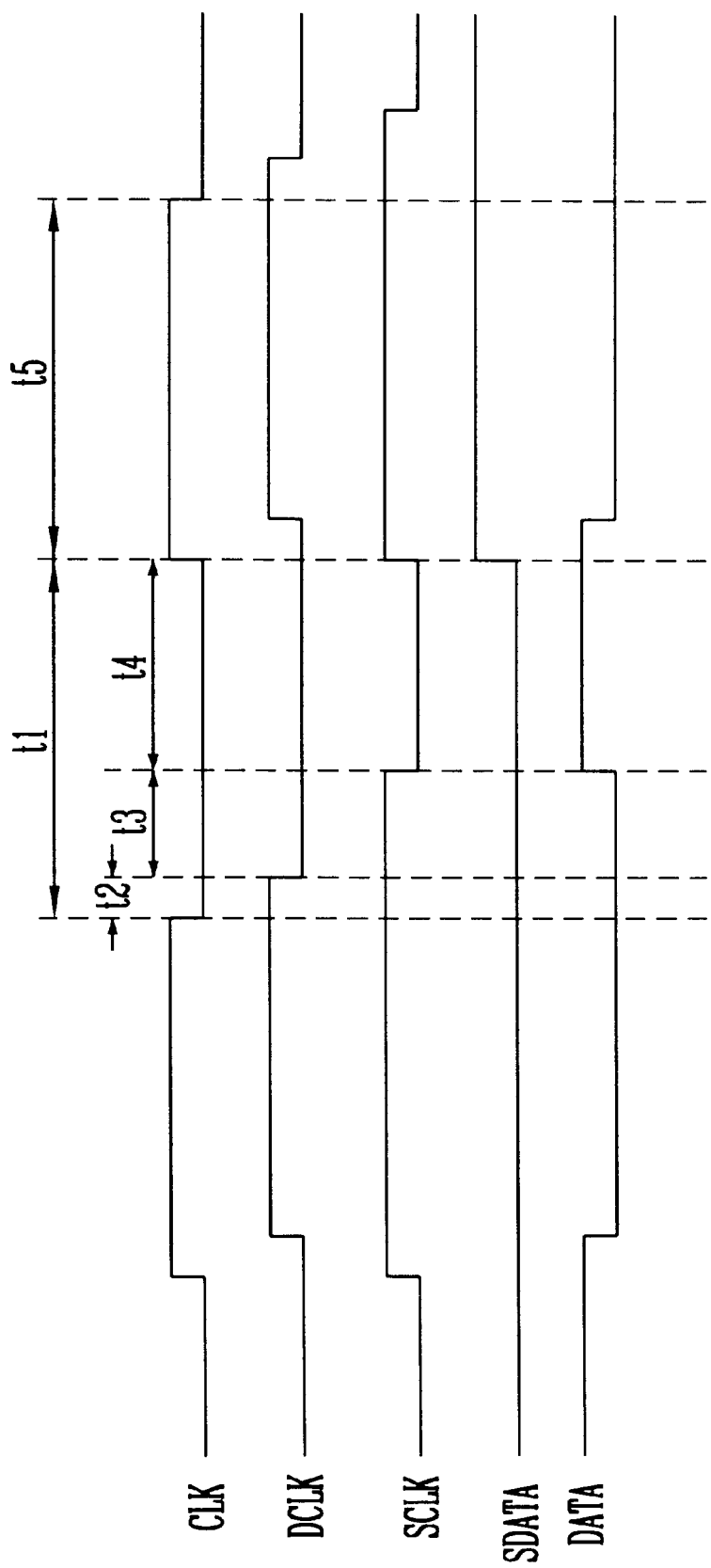
FIG. 4 shows a timing chart for illustrating FIG. 3.

FIG. 3 shows a circuit diagram for illustrating a first embodiment in which the OR gate circuit according to the present invention is applied to the latch block of the state machine; and FIG. 4 shows a timing diagram thereof.

The output out of the latch block 12 becomes a LOW state by means of an initial signal S being HIGH to initiate the latch block 12. That is, the initial signal S being HIGH is inverted into a LOW state via the first inverter I21, thus turning on the fifth PMOS transistor P25. Also, the initial signal S being HIGH is turned on by the second NMOS transistor N22, thereby forming a ground pass. Therefore, the supply power VCC is applied to the first latch 15 and the output of the second latch 16 becomes a LOW state. Then, as the signal being LOW is outputted as LOW state via the fourth and fifth inverters I24 and I25, the latch block 12 is initiated. When the latch block 12 is initiated, the initial signal S becomes a LOW state.

The operation of the circuit at t1 of FIG. 4 will be explained at the state that the latch block 12 is initiated when the clock shifts from HIGH to LOW.

The first transfer gate M1 is turned on by means of the clock being input as LOW. In other words, the PMOS transistor of the first transfer gate M1 is turned on by mean of the clock being LOW and the NMOS transistor of the first transfer gate M11 is turned on by means of the clock which is inverted into HIGH via the third inverter I23. Thus, the first transfer gate M1 is turned on.

As the clock inputted LOW is delayed signal DCLK in very short time via the first delay means 13, the first NMOS transistor N21 is instantly turned on. The potential of the node K21 is maintained at LOW by means of the first NMOS transistor N21 turned on at time t2, regardless of the input data. The data maintained at LOW is latched to the first latch 15 through the first transfer gate M1.

Meanwhile, the delayed signal DCLK delayed through the clock being LOW and the first delay means 13 is further delayed SCLK via the second delay means 14 and is then input to the NOR gate. However, the signal SCLK delayed via the second delay means 14 is maintained at HIGH until time t3 and is then discharged at LOW at time t4. Therefore, the output of the NOR gate until time t3 is maintained at LOW, and as this signal is inverted to HIGH via the second inverter I22, the first PMOS transistor P21 is turned off. As this state changes at time t4, the second PMOS transistor P21 is turned on, thereby applying the supply power VCC to the second through fourth PMOS transistors P22 through P24. The second through fourth PMOS transistors P22 through P24 to which the supply power VCC is applied will make the node K21 become the potential of the supply power VCC depending on the state of the data input into the gate. If any one of the data which are input to the gates of the second through fourth PMOS transistors P22 through P24 is LOW, the potential of the node K21 becomes equal to that of the supply power VCC. This potential being HIGH is latched to the first latch 15 via the first transfer gate M1. At the state that HIGH is latched to the first latch 15, if the clock shifts to HIGH, The second transfer gate M2 is turned on by means of the clock being HIGH at time ts in FIG. 4, and the data being HIGH is latched to the second latch 16 via the second latch M2 which is turned on. The data being HIGH, which is latched at the second latch 16, is outputted through the fourth and fifth inverters I24 and I25.

Figure 5:
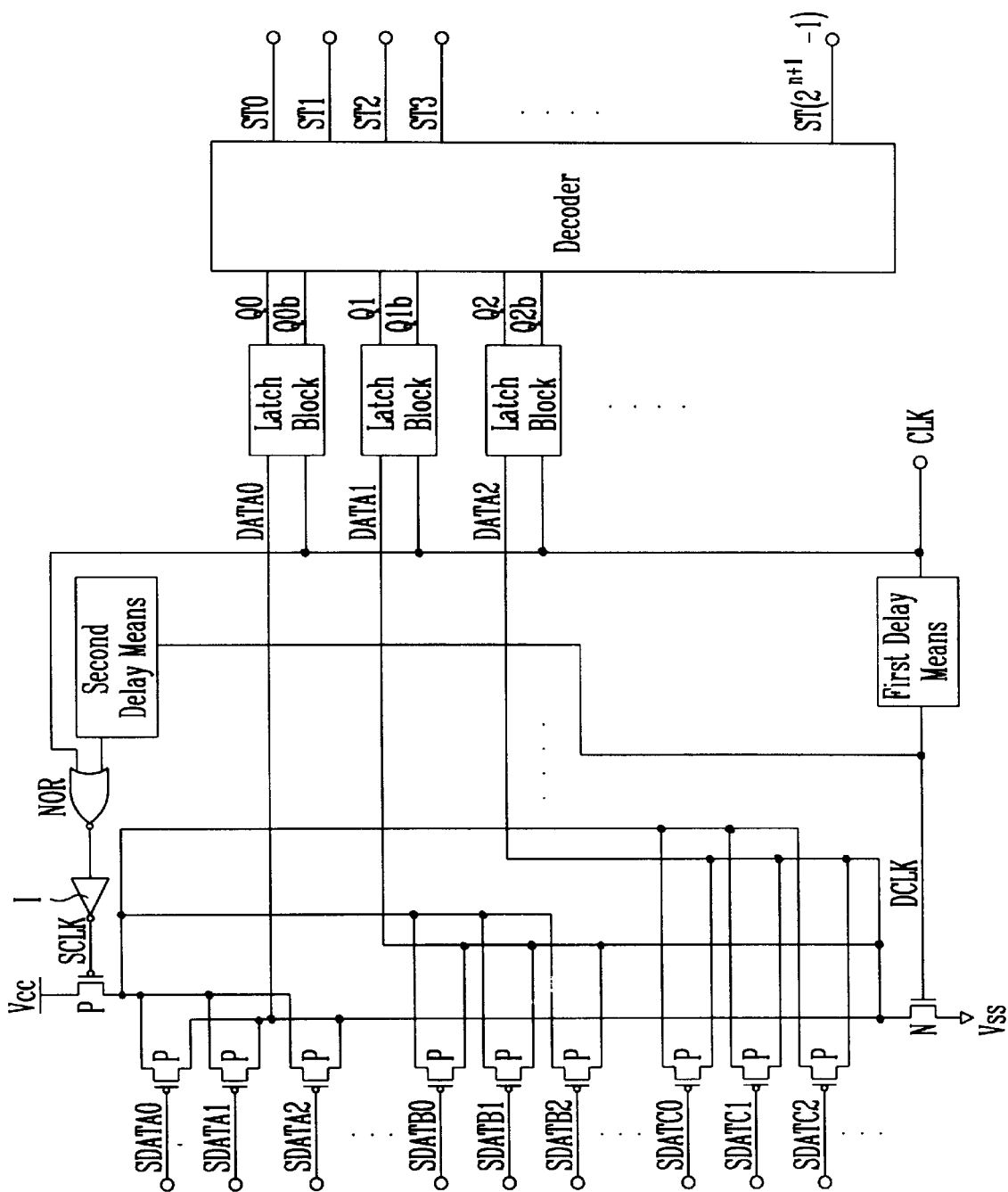
FIG. 5 shows a circuit diagram for illustrating a second embodiment in which the OR gate circuit according to the present invention is applied to the latch block of the state machine.

FIG. 5 shows a circuit diagram for illustrating a second embodiment in which the OR gate circuit according to the present invention is applied to the latch block of the state machine. The output from a plurality of OR gate circuits and a plurality of latch blocks are outputted through a single decoder. In this state machine, n+1 OR gate circuit blocks and latch blocks are required depending on n+1 input signals, and the state of 2n+1−1 number are outputted via the decoder.

Figure 6:
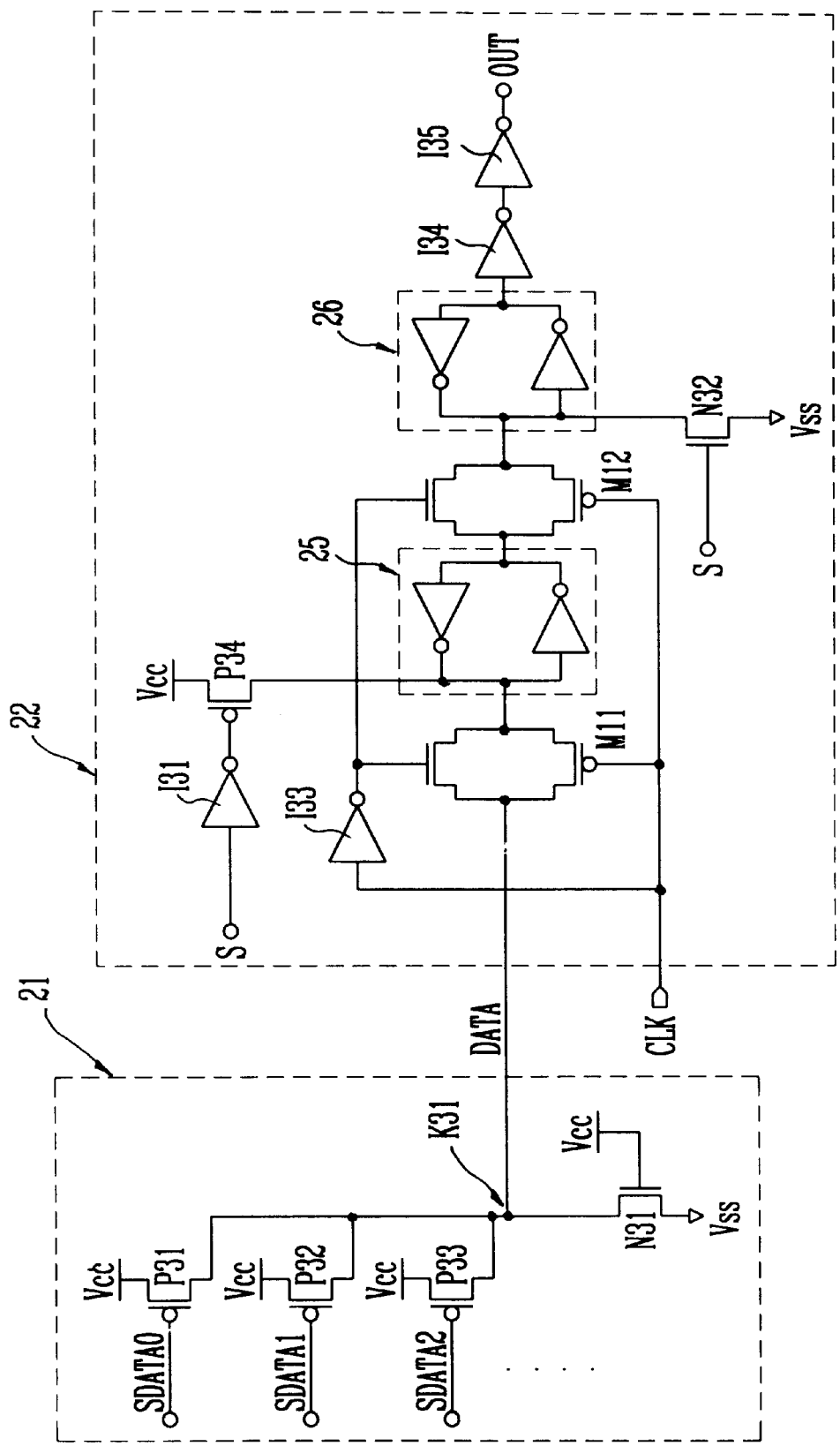
FIG. 6 shows a circuit diagram for illustrating a third embodiment in which the OR gate circuit according to the present invention is applied to the latch block of the state machine.

FIG. 6 shows a circuit diagram for illustrating a third embodiment in which the OR gate circuit according to the present invention is applied to the latch block of the state machine. As shown in the drawing, the construction of the latch block 22 is same to that of the latch block 12 which was explained by reference to FIG. 3. However, the OR gate circuit block 21 is constructed as follows. First, the supply power VCC is directly input as a source of the first through third PMOS transistors P31 through P33 to the gate of which is input the input signals and to the drain of which is connected the node K31. The potential of the node K31 is input to the latch block 22 and is connected to the ground terminal VSS via the first NMOS transistor N31. To the gate of the first NMOS transistor N31 is applied the supply power VCC. As constructed above, if any one of the signals applied to the gates of the first through third PMOS transistors P31 through P33 is LOW, the potential of the node K31 becomes HIGH. However, if the resistance of the first NMOS transistor N31 connected to the ground terminal VSS becomes higher, it is required that the amount of the current flowing into the ground has to be limited.

As can be understood from the above description, the present invention can provide outstanding advantages that it can reduce the number of transistors, power consumption and layout area by controlling the supply power using the clocks.

The present invention has been described with reference to a particular embodiment in connection with a particular application. Those having ordinary skill in the art and access to the teachings of the present invention will recognizes additional modifications and applications within the scope thereof.

It is therefore intended by the appended claims to cover any and all such applications, modifications, and embodiments within the scope of the present invention.

What is claimed is:

1. A state machine, comprising:
   first delay means for delaying a clock signal for a first set time;
   second delay means for delaying an output signal from said first delay means for a second set time;
   circuit for logically combining said clock signal and said output signal from said second delay means;
   first switching means for switching the supply of a supply power in response to an output from said circuit;
   a plurality of switching elements for outputting the supply power received via said first switching means to an output terminal in response to a corresponding plurality of input signals, each switching element comprising a transistor having a gate electrode receiving a corresponding input signal, a drain electrode connected to said first switching means, and a source electrode connected to said output terminal;
   second switching means connected between said output terminal and a ground, said second switching means being controlled depending on at least one output signal from the first delay means; and
   latch means for latching a potential of said output terminal.

2. The state machine according to claim 1, wherein said first switching means is a PMOS transistor.

3. The state machine according to claim 1, wherein said second switching means is a NMOS transistor.

4. The state machine according to claim 1, where said plurality of switching elements are PMOS transistors.

5. A state machine, comprising:
   first delay means for delaying a clock signal for a first set time;
   second delay means for delaying at least one output signal from said first delay means for a second set time;
   circuit for logically combining said clock signal and said at least one output signal from said second delay means;
   first switching means for switching the supply of a supply power in response to an output from said circuit;
   a plurality of switching elements for outputting the supply power received via said first switching means to a corresponding plurality of output terminals in response to a corresponding plurality of input signals, each switching element comprising a transistor having a gate electrode receiving a corresponding input signal, a drain electrode connected to said first switching means, and a source electrode connected to one of said corresponding output terminals;
   second switching means connected between said plurality of output terminals and a ground, said second switching means being controlled depending on at least one output signal from the first delay means; and
   a plurality of latch means each for latching each of the potentials of said plurality of output terminal depending on said clock clocks; and
   decoders for decoding the outputs from said plurality of latch means.

6. The state machine according to claim 5, wherein said first switching means is a PMOS transistor.

7. The state machine according to claim 5, wherein said second switching means is a NMOS transistor.

8. A state machine having a plurality of inputs, comprising:
   a first delay circuit configured to delay a clock signal and output a first delayed signal;
   a second delay circuit configured to delay said first delayed signal and output a second delayed signal;
   a first circuit configured to logically combine said clock signal and said second delayed signal, and output a third signal;
   a first switch circuit configured to switch a supply power, in response to said third signal;
   a plurality of switching elements, each of said switching elements connected to said first switch circuit and configured to output said supply power to an output terminal, in response to a corresponding one of said plurality of inputs;
   a second switch circuit configured to control said output terminal, in response to said first delayed signal; and
   a latching circuit for latching a potential of said output terminal.

9. The state machine according to claim 8, wherein each of said switching elements comprises a transistor having a gate electrode receiving a corresponding one of said input signals, a drain electrode connected to said first switch circuit, and a source electrode connected to said output terminal.

10. The state machine according to claim 8, wherein:
    said plurality of switching elements are configured to output said supply power to a common output terminal, a potential at said common output terminal being reflective of a logical OR of said plurality of inputs.

11. The state machine according to claim 8, wherein:

each of said plurality of switching elements is configured to output said supply power to a separate output terminal, each separate output terminal has a corresponding latching circuit configured to latch a potential of that separate output terminal; and the machine further comprises at least one decoder for decoding outputs of said latching circuits.

12. The state machine according to claim 8, wherein the first switch circuit comprises a PMOS transistor.

13. The state machine according to claim 8, wherein the second switch circuit comprises an NMOS transistor.

14. The state machine according to claim 8, wherein said plurality of switching elements comprise PMOS transistors.

* * * * *